United States Patent
Arp et al.

(10) Patent No.: US 11,163,002 B2
(45) Date of Patent: Nov. 2, 2021

(54) BURN-IN RESILIENT INTEGRATED CIRCUIT FOR PROCESSORS

(71) Applicant: International Business Machines Corporation, Armonk, NY (US)

(72) Inventors: Andreas H. A. Arp, Nufringen (DE);
Matthias Ringe, Tuebingen (DE);
Thomas Makowski, Pfullingen (DE);
Michael V. Koch, Ehningen (DE);
Fatih Cilek, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 100 days.

(21) Appl. No.: 16/197,868

(22) Filed: Nov. 21, 2018

(65) Prior Publication Data

US 2020/0158779 A1    May 21, 2020

(51) Int. Cl.
*G01R 31/317* (2006.01)
*H03K 5/133* (2014.01)
*G01R 31/00* (2006.01)
*H03K 5/00* (2006.01)
*H03K 19/20* (2006.01)

(52) U.S. Cl.
CPC ....... *G01R 31/31725* (2013.01); *H03K 5/133* (2013.01); *G01R 31/003* (2013.01); *H03K 19/20* (2013.01); *H03K 2005/0015* (2013.01); *H03K 2005/00078* (2013.01)

(58) Field of Classification Search
CPC .............. G01R 31/003; G01R 31/00; G01R 31/31725; H03H 11/00; H03H 11/265; H03K 19/00; H03K 19/20; H03K 2005/00; H03K 2005/00078; H03K 2005/0015; H03K 5/00; H03K 5/13; H03K 5/132; H03K 5/133; H03K 5/135
USPC .......................................... 327/261
See application file for complete search history.

(56) References Cited

U.S. PATENT DOCUMENTS

| | | | |
|---|---|---|---|
| 7,944,299 B2 | 5/2011 | Mangudi et al. | |
| 7,973,549 B2 | 7/2011 | Joshi et al. | |
| 8,923,082 B2 | 12/2014 | Kodama | |
| 9,251,890 B1* | 2/2016 | Agarwal | G11C 7/1051 |
| 9,966,126 B2 | 5/2018 | Ahn et al. | |
| 2008/0309364 A1* | 12/2008 | Joshi | G01R 31/31725 |
| | | | 324/750.02 |
| 2011/0074394 A1* | 3/2011 | Gebara | G01R 31/31725 |
| | | | 324/104 |
| 2011/0128081 A1* | 6/2011 | Hars | G06F 7/588 |
| | | | 331/57 |

* cited by examiner

*Primary Examiner* — Lincoln D Donovan
*Assistant Examiner* — Dave Mattison
(74) *Attorney, Agent, or Firm* — Cantor Colburn LLP; Margaret McNamara

(57) ABSTRACT

A burn-in resilient integrated circuit is provided. The burn-in resilient integrated circuit includes an inverter chain and a plurality of inverter circuits on the inverter chain. The burn-in resilient integrated circuit also includes a loop providing an electrical connection from an output of the inverter chain to an input of the inverter chain. The loop is selectable in accordance with a burn-in operation.

6 Claims, 4 Drawing Sheets

_US 11,163,002 B2_

BURN-IN RESILIENT INTEGRATED CIRCUIT FOR PROCESSORS

BACKGROUND

The disclosure relates generally to processors, and more specifically, to a burn-in resilient integrated circuit for processors.

In general, skitter is a cognomen for skew and jitter measurements. A skitter circuit is a component of an integrated circuit and allows for measuring periodic signals. More particularly, skitter circuits can only detect transitions, but whether a signal is rising or falling remains unknown or needs to be derived from other data. Further, current skitter circuits also lack mechanisms for accommodating burn-in operations for a processor. Burn-in, in general, is a method to find and sort out processors that would otherwise fail very early in their life cycle. During burn-in operations, the processors operate with high voltage and high temperature that cause design weaknesses to show up fast.

SUMMARY

According to one or more embodiments, a burn-in resilient integrated circuit is provided. The burn-in resilient integrated circuit includes an inverter chain and a plurality of inverter circuits on the inverter chain. The burn-in resilient integrated circuit also includes a loop providing an electrical connection from an output of the inverter chain to an input of the inverter chain. The loop is selectable in accordance with a burn-in operation.

According to one or more embodiments, the above burn-in resilient integrated circuit can be implemented in a processor and/or a system.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter is particularly pointed out and distinctly claimed in the claims at the conclusion of the specification. The foregoing and other features, and advantages of the embodiments herein are apparent from the following detailed description taken in conjunction with the accompanying drawings in which:

DETAILED DESCRIPTION

Figure 1:
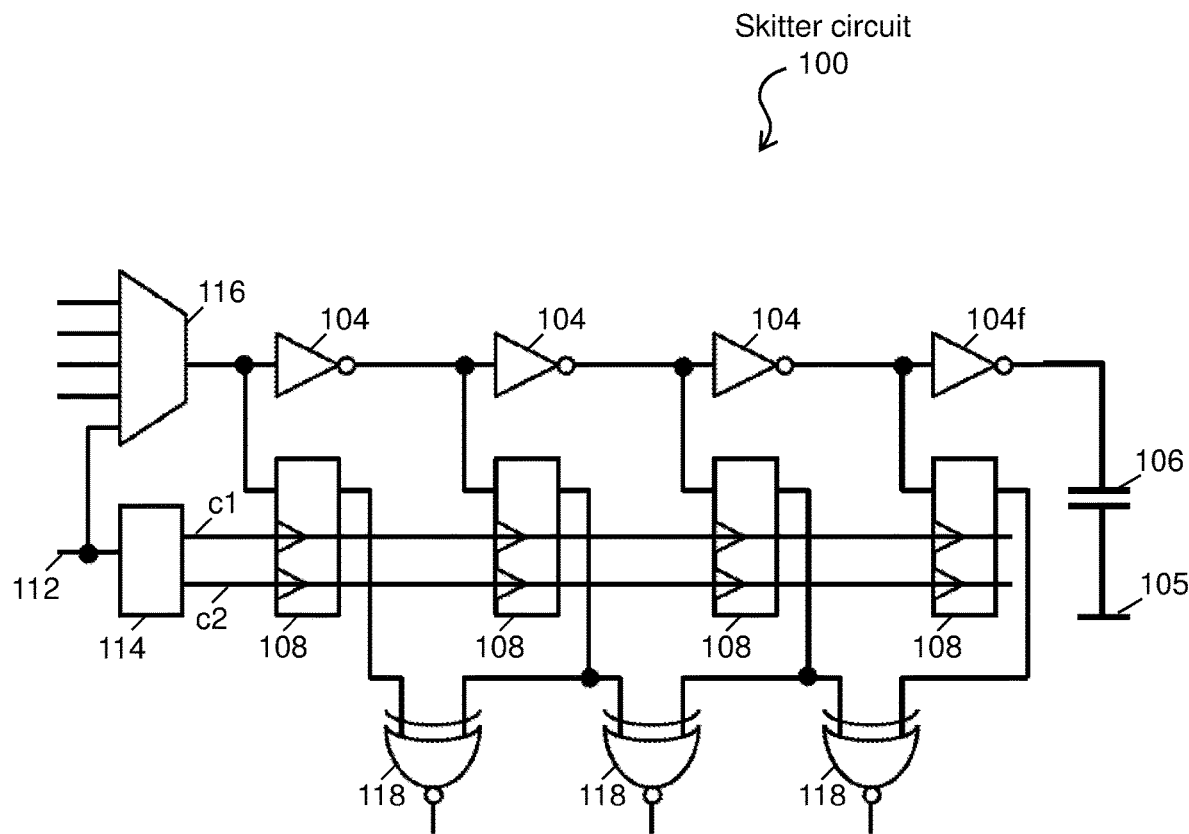
FIG. 1 depicts a schematic diagram showing a skitter circuit in accordance with one or more embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, as discussed above, current skitter circuits lack mechanisms for accommodating burn-in operations for a processor (i.e., devoid of burn-in resiliency).

Referring now to FIG. 1, a skitter circuit 100 includes an inverter chain (e.g., inverting delay element) including a plurality of inverting circuits 104. The plurality of inverting circuits 104 is even in number, with an inverting circuit 104*f* representing a final inverting circuit. The final inverting circuit is connected to a ground 105 via a capacitor 106. The inverter circuits 104 may include inverters, although of types of inverter circuits may be employed instead of or in addition to inverters, e.g., inverting transmission gates, stacked inverters, logic gates, etc. A plurality of sampling latches 108 tap the inverter chain, such that a data input for each latch 108 is connected between two inverter circuits 104.

The latches 108 are clocked in accordance with clocks c1 and c2. Clocks c1 and c2 are derived from a global clock 112, which may be a chip clock or even a local clock for a portion of an integrated circuit chip. Clock 112 may be split in a local clock block (LCB) 114, such that c1 and c2 are the data capture and data launch clocks which are derived from the same clock global signal, running along different conductors. In one embodiment, c1 operates a master latch and c2 operates a slave latch in latches 108. (However, for some master-slave latches, only one clock is needed.) The rising edge of the clock may trigger the master, and the falling edge of the clock may trigger the slave. Latches 108 are operated in accordance with c1 and c2 to pass sampled data received from the inverter chain. Any number of latches 108 may be employed to correspond with a structure or bandwidth of a given device and may be changed as needed.

A multiplexer 116 may selectively switch between different clock signals, which are input to the skitter circuit 200 for edge detection. The initial inverter circuit 104 and sampling latch data is an alternating pattern of 1's and 0's. Edges of the clock signal result in mid-cycle edges and full cycle edges. By analyzing the latch outputs, a sequence of binary data results in an alternating pattern where the edges or transitions are denoted by binary digits of a same value adjacent to one another (e.g., 11 or 00). The latch outputs are coupled to exclusive NOR gates (XNOR) 118 or other equivalent logic. The XNOR gates 118 test whether adjacent latches 108 have the same data value. The XNOR gates 118 determine edge locations for internal pulses.

In accordance with one or more embodiments, an operation of the skitter circuit 100 is described. Assuming input clock can be static; all inverters (e.g., inverter circuits 104) are also static and their outputs have inverted signals of their inputs. These Boolean values are latched by registers (e.g., latches 108) and then XNORed (e.g., XNOR gates 118). The Boolean XNOR function yields one if both inputs are equal. In the static case assumed here, this cannot be the case. Thus, the outputs of all XNOR gates 118 are zero.

Assuming that the selected input at the multiplexer 116 has a rising transition and all registers (e.g., latches 108) are being latched when the inverter (e.g., initial inverter circuit 104) is switching, the input of the inverter has already switched from zero to one while the output of the inverter has not yet made the transition and remains at one as well. In this instance, both input and output of the inverter are one, and the output of the corresponding XNOR will also be one. The skitter circuit 100, thus, yields a sequence of zeros and ones with the ones representing a transition of the signal under test. As the delay of the inverters can be assumed to be nearly constant this allows for judging on duty-cycle, jitter, and skews.

With respect to burn-in operations (a.k.a., stress-test including high voltage and high temperatures) on a processor comprising the skitter circuit 100, the skitter circuit 100 is turned off. For instance, the skitter circuit 100 is a measurement only circuit that is only used in a bring-up operation (e.g., a processor design debug). Therefore, to save power, the skitter circuit 100 is disabled when the processor is functional operation mode (i.e., not debug mode). Usually, this functional operation mode is used during processor burn-in.

When the skitter circuit 100 is turned off, internal nets of the skitter circuit 100 are not switching and specific transistors of the inverter circuits 104 remain open (i.e., always the same transistors if the inverters are active), while others remain closed. Unfortunately, because the open transistors fully experience the burn-in operations, these transistors are aging more than the closed transistors (e.g., asynchronous aging). For instance, due to leakage, the open transistors will drive current while the closed transistors do not. Asynchronous aging equates to the open transistors getting slower (increased intrinsic delay) at a significantly accelerated rate greater than the closed transistors (the inactive transistors are not facing any aging). Further, this skewed delay for the transistors is causing different delays for the rising vs. falling clock edges traveling thru the skitter circuit 100. Practically, when using the skitter circuit 100 after a burn-in, the skitter circuit 100 shows a duty cycle distortion of a clock that is only caused be the skitter circuit 100 itself.

Turning now to an overview of the aspects of the invention, one or more embodiments of the invention address the above-described shortcomings of the prior art by providing a burn-in resilient integrated circuit in a processor. More particularly, the burn-in resilient integrated circuit uses a chain to feedback a signal to an input of the inverter chain during burn-in operations to toggle the inverter chain and avoid asynchronous aging. Note that the burn-in resilient integrated circuit may be implemented in a processor, a system, or combination thereof.

Figure 2:
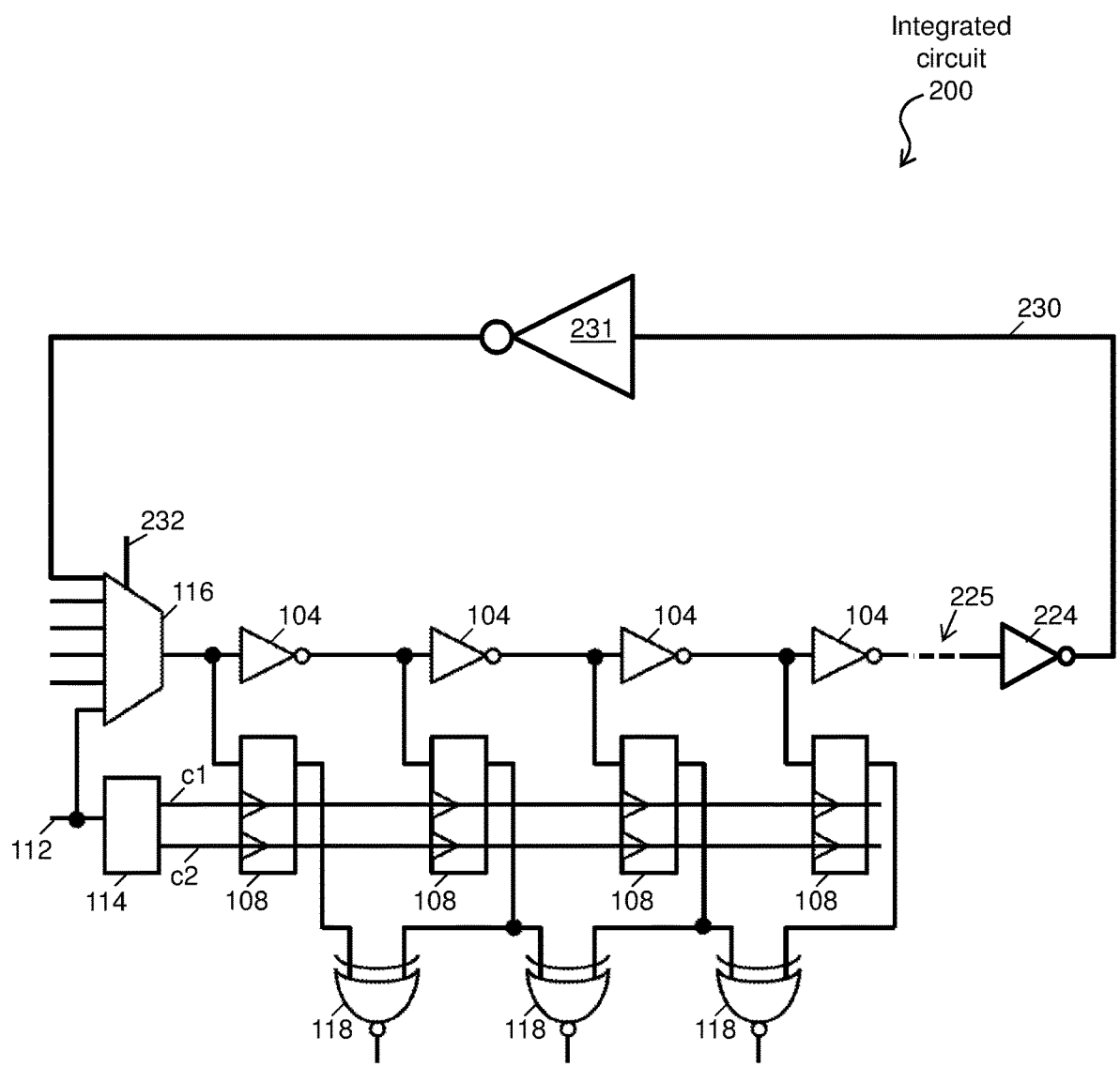
FIG. 2 depicts a circuit diagram showing an integrated circuit in accordance with one or more embodiments.

Turning now to FIG. 2, a schematic diagram flow of an integrated circuit 200, which is an example of a burn-in resilient integrated circuit described herein, in accordance with one or more embodiments. Elements of the integrated circuit 200 that are similar to the skitter circuit 100 of FIG. 1 maintain the same numerical identifiers and are not reintroduced for brevity. Note that the plurality of inverter circuits 104 of the integrated circuit 200 is even in number, with a inverting circuit 224 representing a final inverter circuit (and the dashed line 225 representing a continuation of the inverter chain with multiple inverter circuits 104).

The integrated circuit 200 includes a loop 230 from the inverter circuit 224 to the multiplexer 116. An inverter 231 is located on the loop 230, and the multiplexer 116 includes an enable pin 232 for selecting the loop 230 as an input to the inverter chain (e.g., to enable the ring oscillator mode). When the enable pin 232 is engaged, the loop 230 is activated and the plurality of inverter circuits 104 of the integrated circuit 200 increases by one (to make an odd number). In turn, the integrated circuit 200 can be referred to as an inverted inverter chain and provides a feedback signal to an input of a inverter chain therein via the multiplexer 116. More particularly, during burn-in operation, the inverted inverter chain output (e.g., output of the inverting circuit 224) is fed back to its input (e.g., input of the initial inverting circuit 104) to implement a long ring oscillator that will guarantee the plurality of inverter circuits 104 switch/toggle. Note that only the inverter chain is driven by the feedback while the LCB 114 are not clocked.

In accordance with one or more embodiments, the ring oscillator frequency f is based on an inverting delay D according to Equation 1.

$$f=1/(2*D)$$  Equation 1

For example, assuming the inverting delay of one nanosecond for an inverter chain of 150 inverters (e.g., inverter circuits 104), the frequency is 3.33 MHz (which is much slower than state of the art clocks, i.e., because the integrated circuit 200 uses less power).

Figure 3:
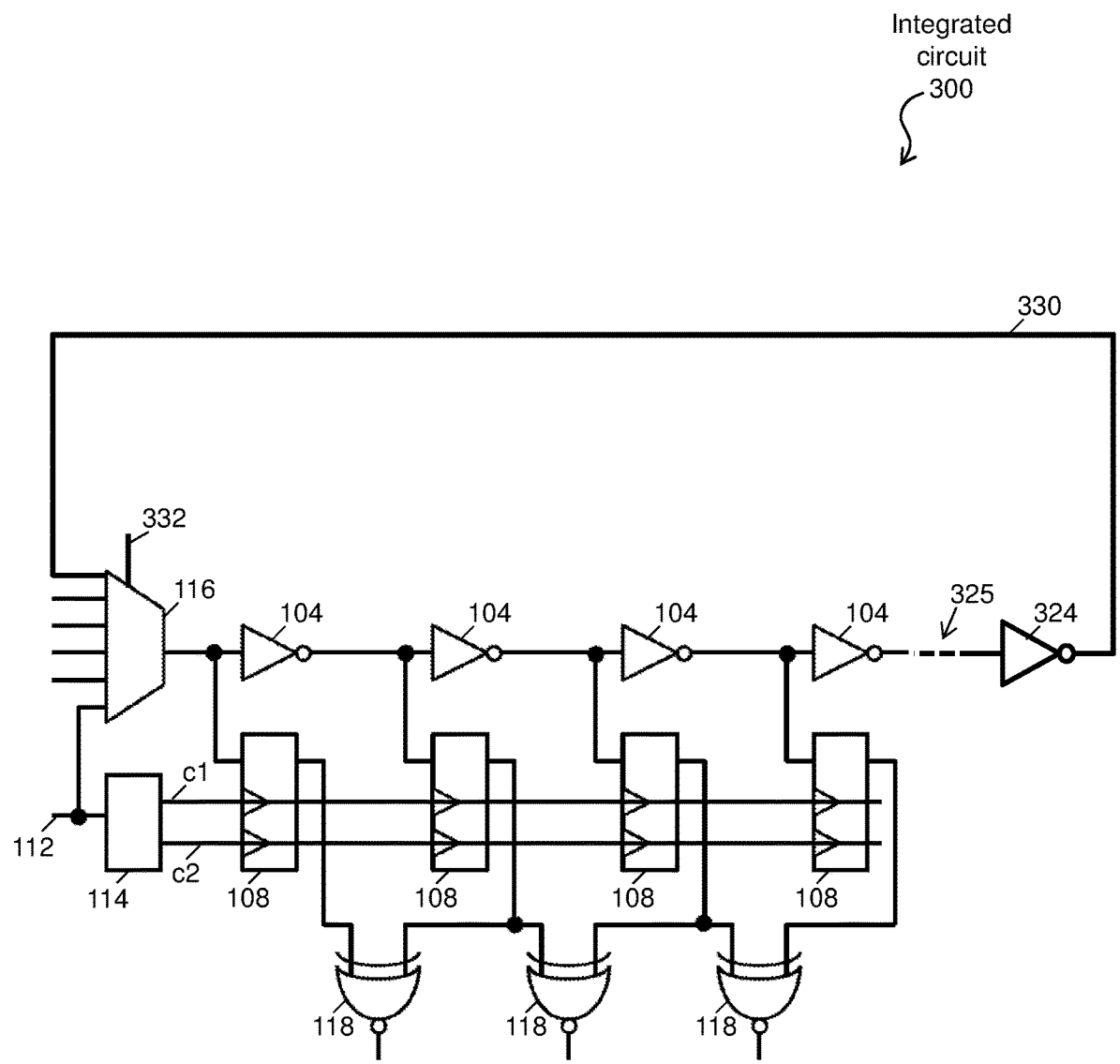
FIG. 3 depicts a circuit diagram showing an integrated circuit in accordance with one or more embodiments.

Turning now to FIG. 3, a schematic diagram flow of an integrated circuit 300, which is an example of a burn-in resilient integrated circuit described herein, in accordance with one or more embodiments. Elements of the integrated circuit 300 that are similar to the skitter circuit 100 of FIG. 1 maintain the same numerical identifiers and are not reintroduced for brevity. As shown, the integrated circuit 300 is an inverter chain that provides a feedback signal to an input of a inverter chain therein. Note that the plurality of inverter circuits 104 of the integrated circuit 300 is odd in number, with a inverting circuit 324 representing a final inverting circuit (and the dashed line 325 representing a continuation of the inverter chain with multiple inverter circuits 104).

The integrated circuit 300 includes a loop 330 from the inverting circuit 324 to the multiplexer 116. The multiplexer 116 includes an enable pin 332 for selecting the loop 330 as an input to the inverter chain (e.g., to enable the ring oscillator mode). Note that the loop 330 does not include an inverter (in contrast to the inverter 231 of FIG. 2) because the plurality of inverter circuits 104 of the integrated circuit 300 is already odd in number.

When the enable pin 332 is engaged, the loop 330 is activated and provides a feedback signal to an input of a inverter chain via the multiplexer 116. More particularly, during burn-in operation, the inverter chain output (e.g., output of the inverting circuit 324) is fed back to its input (e.g., input of the initial inverting circuit 104) to implement a long ring oscillator that will guarantee the plurality of inverter circuits 104 switch/toggle. Note that only the inverter chain is driven by the feedback while the LCB 114 are not clocked.

Figure 4:
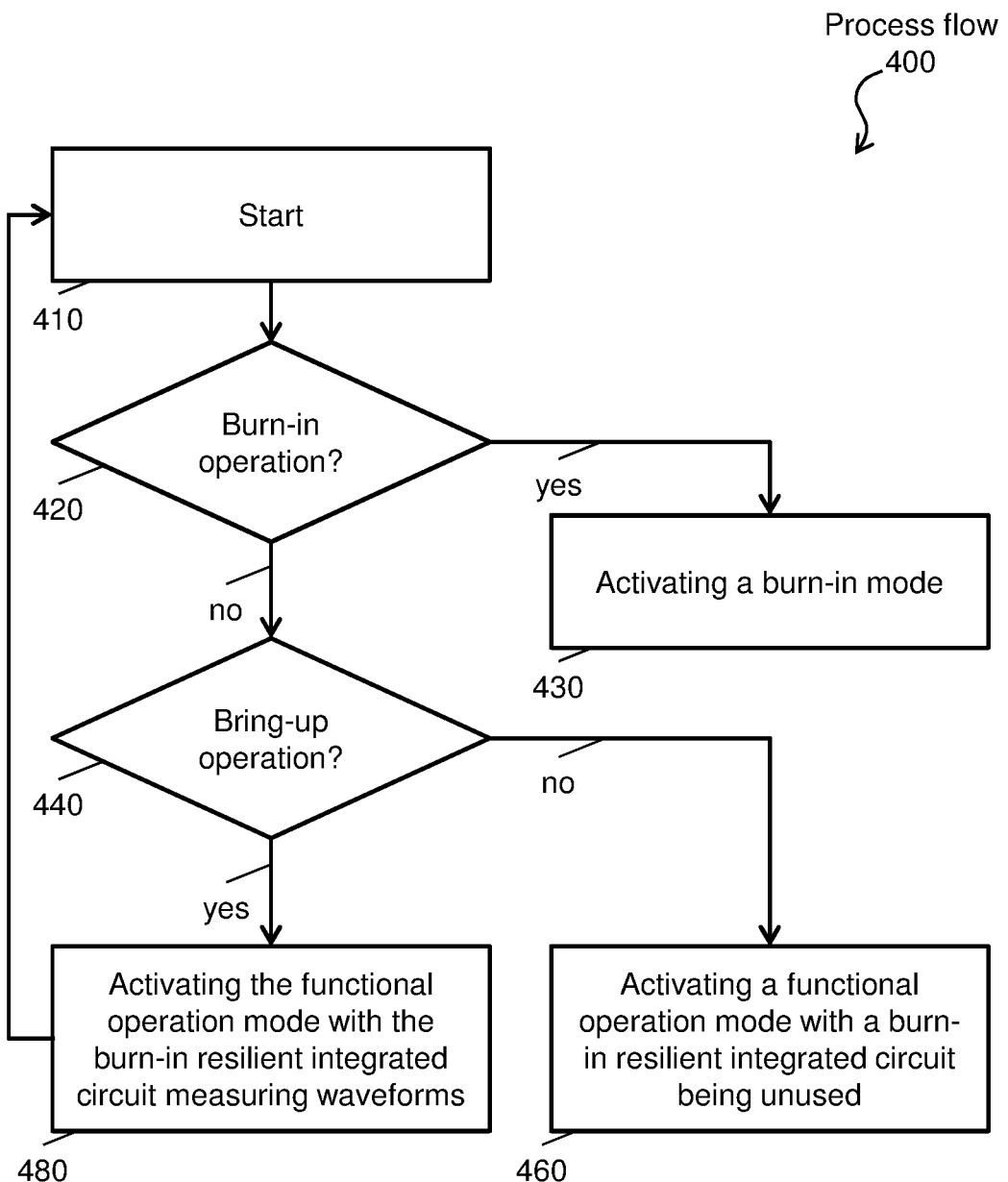
FIG. 4 depicts a process flow in accordance with one or more embodiments.

Turning to FIG. 4, a process flow 400 is shown in accordance with one or more embodiments. The process flow 400 is an example operation of the burn-in resilient integrated circuit described herein.

The process flow 400 starts at block 410 and proceeds to decision block 420. At decision block 420, the processor including the burn-in resilient integrated circuit determines whether a burn-in operation will occur. If yes, the process flow 400 proceeds to block 430, where the burn in mode is activated. For example, the enable pin 232 and 332 is engaged (i.e., :=on) and the burn-in resilient integrated circuit oscillates. If no, the process flow 400 proceeds to decision block 440.

At decision block 440, the processor including the burn-in resilient integrated circuit determines whether a bring-up operation will occur. If no, the process flow 400 proceeds to block 460 where the processor is placed into a function operation mode and the burn-in resilient integrated circuit is unused. For example, the enable pin 232 and 332 is not engaged (i.e., :=off). If yes, the process flow 400 proceeds to block 480 where the processor is placed into a function operation mode and the burn-in resilient integrated circuit measures waveforms. For example, the enable pin 232 and 332 is not engaged (i.e., :=off).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A burn-in resilient integrated circuit comprising:
an inverter chain;
a plurality of inverter circuits on the inverter chain, wherein a number of the plurality of inverter circuits is even;
a multiplexer comprising an enable pin; and
a selectable loop comprising an additional inverter, wherein the selectable loop provides an electrical connection for a feedback signal from an output of the inverter chain to an input of the inverter chain via the additional inverter and the multiplexer, the burn-in resilient integrated circuit configured to:
receive an engage signal corresponding to a burn-in operation at the enable pin; and
based on receiving the engage signal corresponding to the burn-in operation, activate the selectable loop, wherein activating the selectable loop causes the feedback signal in the burn-in resilient integrated circuit to oscillate,
wherein the burn-in resilient integrated circuit further configured to:
based on not receiving the engage signal corresponding to the burn-in operation at the enable pin, deactivate the selectable loop, wherein the feedback signal is not provided from the output of the inverter chain to the input of the inverter chain based on the selectable loop being deactivated.

2. The burn-in resilient integrated circuit of claim 1, wherein the burn-in resilient integrated circuit does not oscillate based on not receiving the engage signal.

3. A processor comprising a burn-in resilient integrated circuit comprising:
an inverter chain;
a plurality of inverter circuits on the inverter chain, wherein a number of the plurality of inverter circuits is even;
a multiplexer comprising an enable pin; and
a selectable loop comprising an additional inverter, wherein the selectable loop provides an electrical connection for a feedback signal from an output of the inverter chain to an input of the inverter chain via the additional inverter and the multiplexer, the burn-in resilient integrated circuit configured to:
receive an engage signal corresponding to a burn-in operation at the enable pin; and
based on receiving the engage signal corresponding to the burn-in operation, activate the selectable loop, wherein activating the selectable loop causes the feedback signal in the burn-in resilient integrated circuit to oscillate,
wherein the burn-in resilient integrated circuit further configured to:
based on not receiving the engage signal corresponding to the burn-in operation at the enable pin, deactivate the selectable loop, wherein the feedback signal is not provided from the output of the inverter chain to the input of the inverter chain based on the selectable loop being deactivated.

4. The processor of claim 3, wherein the burn-in resilient integrated circuit does not oscillate based on not receiving the engage signal.

5. A method comprising:
receiving an engage signal corresponding to a burn-in operation at an enable pin of a multiplexer of a burn-in resilient integrated circuit, the burn-in resilient integrated circuit comprising:

an inverter chain;
a plurality of inverter circuits on the inverter chain, wherein a number of the plurality of inverter circuits is even;
the multiplexer comprising the enable pin; and
a selectable loop comprising an additional inverter, wherein the selectable loop provides an electrical connection for a feedback signal from an output of the inverter chain to an input of the inverter chain via the additional inverter and the multiplexer; and
based on receiving the engage signal corresponding to the burn-in operation, activate the selectable loop, wherein activating the selectable loop causes the feedback signal in the burn-in resilient integrated circuit to oscillate; and
based on not receiving the engage signal corresponding to the burn-in operation at the enable pin, deactivating the selectable loop, wherein the feedback signal is not provided from the output of the inverter chain to the input of the inverter chain based on the selectable loop being deactivated.

6. The method of claim 5, wherein the burn-in resilient integrated circuit does not oscillate based on not receiving the engage signal.

* * * * *